United States Patent
Sonnenberg et al.

(10) Patent No.: US 6,712,904 B1
(45) Date of Patent: Mar. 30, 2004

(54) DEVICE FOR PRODUCING SINGLE CRYSTALS

(75) Inventors: Klaus Sonnenberg, Niederzier (DE); Eckhard Küssel, Düren (DE); Thomas Bünger, Chemnitz (DE); Tilo Flade, Freiberg (DE); Berndt Weinert, Freiberg (DE)

(73) Assignees: Forschungszentrum Julich GmbH, Julich (DE); Frieberger Compound Materials GmbH, Frieberg (DE)

( * ) Notice: Subject to any disclaimer, the term of this patent is extended or adjusted under 35 U.S.C. 154(b) by 0 days.

(21) Appl. No.: 09/937,107

(22) PCT Filed: Mar. 16, 2000

(86) PCT No.: PCT/EP00/02349

§ 371 (c)(1),
(2), (4) Date: Sep. 19, 2001

(87) PCT Pub. No.: WO00/56954

PCT Pub. Date: Sep. 28, 2000

(30) Foreign Application Priority Data

Mar. 19, 1999 (DE) .......................... 199 12 484

(51) Int. Cl.$^7$ .................... C30B 11/00; C30B 29/42
(52) U.S. Cl. ................ 117/222; 117/217; 117/219; 117/83; 164/122; 164/122.1; 164/122.2; 164/123
(58) Field of Search ................. 151/222, 217, 151/219, 83; 164/122, 122.1, 122.2, 123

(56) References Cited

U.S. PATENT DOCUMENTS

| | | | |
|---|---|---|---|
| 2,281,718 A | * 5/1942 | Scully et al. .............. | 164/123 |
| 3,204,301 A | 9/1965 | Flemings, Jr. .............. | 22/24 |
| 4,086,424 A | 4/1978 | Mellen, Sr. ................. | 13/24 |
| 4,423,516 A | 12/1983 | Mellen, Sr. ................. | 373/111 |
| 4,518,351 A | 5/1985 | Mellen, Sr. ................. | 432/18 |
| 4,824,519 A | * 4/1989 | Ostrogorsky ............... | 117/17 |
| 5,116,456 A | * 5/1992 | Nestor ........................ | 117/83 |
| 6,071,337 A | * 6/2000 | Sakurada et al. ........... | 117/13 |

FOREIGN PATENT DOCUMENTS

| | | | |
|---|---|---|---|
| DE | 33 23 896 A1 | 1/1985 | |
| DE | 38 39 970 A1 | 5/1990 | |
| EP | 0 887442 A1 | 12/1998 | .......... C30B/11/00 |
| EP | 939146 A1 | 9/1999 | .......... C30B/11/00 |
| JP | 102 03 891 A | 4/1998 | |

OTHER PUBLICATIONS

Althaus et al., "Some new design features for vertical Bridgman furnaces and the investigation of small angle grain boundries developed during VB growth of GaAs.", Journal of Crystal Growth 166 (1996) p. 566–571.*

* cited by examiner

Primary Examiner—Nadine G. Norton
Assistant Examiner—Matthew Song
(74) Attorney, Agent, or Firm—George W. Neuner; Edwards & Angell, LLP

(57) ABSTRACT

A device is made available for producing monocrystals, for example large-diameter gallium arsenide monocrystals, that has a cylindrical heating appliance with a floor heater (2) and a cover heater (3). The heating surfaces of the floor and the cover heater are considerably larger than the cross-sectional area of the monocrystal to be produced. In addition, an insulator (6) is planned for the reaction space that is designed to prevent a radial heat flow and the guarantee a strictly axial heat flow over the complete height of the reaction space between the cover heater (3) and the floor heater (2).

26 Claims, 1 Drawing Sheet

DEVICE FOR PRODUCING SINGLE CRYSTALS

Figure 1:
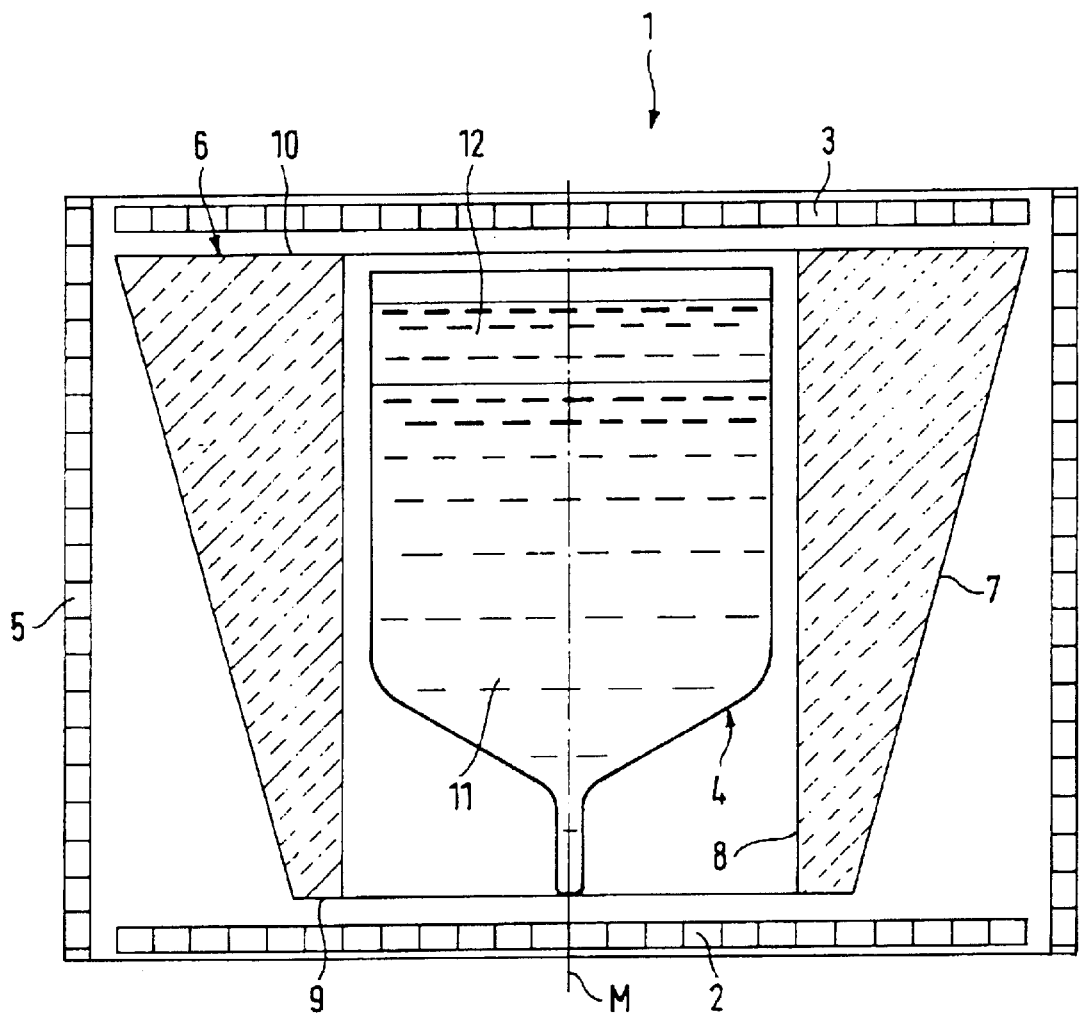

The invention concerns a device for producing monocrystals. In particular the invention concerns a device for producing monocrystals of various materials, for example III–V materials, for example of gallium arsenide monocrystals.

Familiar devices for producing monocrystals of various materials, for example III–V materials, for example of gallium arsenide monocrystals, generally comprise multiple temperature zone furnaces, such as those described in DE-OS-38 39 97 and in U.S. Pat. Nos. 4,086,424, 4,423,516 and 4,518,351.

These multiple temperature zone furnaces can consist not only of metal heat conductors but also of heating conductors containing carbon The so-called multiple zone tube furnaces enable a variable structure of a temperature field suitable for crystal growth and its displacement along the furnace's axis of rotation.

However, devices of this kind are characterized not only by an axial but also by a radial heat flow that can lead to a variable growth rate and to an unfavorable formation of the interphase melt-crystal.

In addition, multizone or multiple temperature zone furnaces are composed of a variety of thermal construction elements and this requires considerable expense for dismantling and assembling for maintenance work. As the number of zones increases the amount of automation increases and with it the susceptibility to faults of multizone furnaces.

In particular for the production of monocrystals with a large diameter, for example 2", 3", 100 mm, 125 mm, 150 mm 200 mm and above, there is the problem that a radial heat flow in the crystal has an effect on the isotherms, i.e. on the interphase melt-monocrystal in a vertical or axial direction respectively.

A device characterized by an insulating device being planned that is designed in such a way that a heat flow in a radial direction vertical to the rotation axis (M) of the furnace (1) can be restricted to a preset rate and whereby the insulating device (6) is designed so that its insulating effect is reduced from the cover heater (3) to the floor heater (2) is familiar from the Journal of Crystal Growth, NL, North-Holland Publishing Co. Amsterdam, Vol. 166, No. ¼, Sep. 1, 1996, pages 566–571.

The task of the invention is to provide a device for producing monocrystals, in particular monocrystals of various III–V materials, for example from gallium arsenide, in which the heat control is almost exclusively axial.

The task is solved by means of a device for producing a monocrystal by growing from a melt of raw materials of the monocrystal to be produced with a heating appliance (1) for generating a temperature gradient within the melt of raw material whereby the heating appliance (1) has a rotationally symmetrical furnace (1) with a rotation axis (M) and with an essentially level floor heater (2) and an essentially level cover heater (3) that can be controlled to different temperatures and characterized by an insulating device being planned that is designed in such a way that a heat flow in a radial direction vertical to the rotation axis (M) of the furnace (1) can be restricted to a preset rate and whereby the insulating device (6) is designed so that its insulating effect is reduced from the cover heater (3) to the floor heater (2).

In certain preferred embodiments of the invention, the device has a furnace designed cylindrically and a controller that is designed in such a way that the temperature of the floor heater (2) can be reduced in comparison with the temperature of the cover heater. In other preferred embodiments, the device has an insulator device (6) that is designed as a tapered cone body with a coaxial cylindrical hollow space that is open at the top and bottom and placed in the furnace (1) in such a way that the tapered end is towards the floor heater (2). Preferably, the insulator device is made, for example, of graphite. In other preferred embodiments, the device comprises a furnace (1) having a jacket heater (5). In still other preferred embodiments, the device comprises a heat transmission part (6) having a rotationally symmetrical profiled or unprofiled shape. In yet other preferred embodiments, the device includes a heating surface of the heaters being calculated in a ratio to the diameter of the monocrystal to be produced so that a temperature that is essentially homogeneous over the radial cross-section surface of the monocrystal to be produced can be generated together with a temperature gradient between the first heater (2) and the second heater (3) that is essentially homogeneous and constant. Preferably, the size of the surface of each heater (2, 3) is at least 1.5 times the cross-sectional area of the monocrystal to be produced is calculated. Preferably, the controller is designed so that the temperature of the first level heater (2) can be lowered continuously as against the second level heater (3). In still other preferred embodiments, the clearance between the heaters is greater than the length of the monocrystal to be produced. In yet further preferred embodiments, a crucible (4) for receiving a melt of raw material of the monocrystal to be produced is provided between the first heater (2) and the second heater (3). Preferred devices of the present invention are particularly suited for the production of a monocrystal from a III–V composite semiconductor, for example, a monocrystal of gallium arsenide.

The device has the advantage that a homogeneous axial heat flow is guaranteed and that practically no heat at all can run off in a radial direction, i.e. of a radially homogeneous temperature at the upper and lower heating plates and the intermediate sections.

Other elements and expediencies can be seen in the description of a design example by means of FIG. 1.

The FIGURE shows a schematic cross-section view of the device according to the invention with an axis of rotation M extending vertically.

The device for producing monocrystals has a cylinder-shaped furnace 1 with a lower heating plate as the floor heater 2 and an upper heating plate as the cover heater 3. The high-temperature heat conducting plates (e.g. CFC) have a circular cross-section. The diameter of the floor heater 2 and of the cover heater 3 is not less than 1.5 to 2 times the diameter of the crystal to be produced, so that there are no radial heat flows in the system that are caused among other things through the non-rotationally symmetrical influences of the current supply. The clearance between floor heater 2 and cover heater 3 is dimensioned so that a crucible 4 for the crystal growth can be located between them.

A control appliance that is not shown is planned with which floor heater 2 and cover heater 3 can be triggered in such a way that cover heater 3 can be kept roughly at the melting temperature of the material to be processed and floor heater 2 can be kept at a slightly lower temperature. The controller is in addition designed so that the temperature of floor heater 2 can be continuously reduced in the growth process in comparison with the temperature of the cover heater, so that the melt of the raw material in the crucible 4 can harden continuously from bottom to top.

The cylindrical furnace 1 has in addition a jacket heater 5 that is formed for example in the cylindrical boundary wall of the furnace. There is a control appliance planned that is designed so that the jacket heater 5 can be held at a temperature in the proximity of the melting point of the raw material in the crucible.

To prevent a flow of heat in a radial direction the furnace 1 has in addition a rotationally symmetrical insulator 6 made of heat-insulation material. Insulator 6 has the shape of a tapered body with a coaxial cylindrical interior that is open at the top and the bottom. The outer wall 7 of the insulator 6 is therefore shaped like a truncated cone and the inside wall 8 is shaped like a cylinder. Insulator 6 is arranged in the furnace in such a way that the tapered end 8 is in the direction of floor heater 2 and the end opposite to the tapered end is in the direction of cover heater 3. The inside diameter of the insulator is greater than the diameter of the crucible 4 that is to be inserted. The insulator is made preferably of graphite. The hollow truncated cone shape of the heat conducting profile 6 results in a free radiation space 9 between the heat conducting profile and the jacket heater 5 that contributes to the azimuthal compensation of the temperature through the main heater.

The design and arrangement of insulator 6 in the furnace 1 described above brings about a reduction in the heat insulation moving from the cover heater 3 to the floor heater 2 in a radial direction between a melt of raw material in crucible 4 and the jacket heater 5.

For operational purposes the crucible 4, which contains the crystal nucleus is placed into the furnace. Boroxide $B_2O_3$ and polycrystalline gallium arsenide are then added. The jacket heater 5 is then triggered in such a way that it is brought to a temperature that is sufficient to heat the reaction space to the working temperature and to melt the solid feedstock material. The added polycrystalline gallium arsenide is melted so that it forms a gallium arsenide melt 10 and is covered by a covering melt 11 made of molten $B_2O_3$ so that contact of the gallium arsenide with the crucible wall is prevented.

The growing process is then carried out as follows. The cover heater 3 is brought to a temperature of approx. 1300° C. and the floor heater 2 is brought to a temperature of approx. 1200° C. A temperature gradient is formed between the cover heater 3 and the floor heater 2 that is practically the temperature gradient that is found between two infinite parallel level plates. The temperature of the floor heater is then reduced continuously so that the melt 11 in the crucible 4 crystallizes out evenly from bottom to top. By controlling and/or regulating the temperature of the floor heater 2 relative to the temperature of the cover heater 3 it is possible to move the vertical position of the melt isotherms between the two heaters and therefore to control the crystallization. The jacket heater must be corrected slightly throughout the process time to maintain the ideal axial temperature, because the system's overall energy level is reduced, and to ensure that the radial losses, that are compensated for through the jacket heater, are reduced.

The jacket heater 5 serves to compensate global heat losses and to prevent a radial heat flow. Through insulator 6 a high level of insulation is achieved in the area of cover heater 3 in a radial direction and a lower level of insulation in the area of floor heater 2 in a radial direction. This guarantees an axial heat flow parallel to the rotation axis of the furnace during the crystallization process.

During the crystallization process and thereafter isotherm formation in the reaction vessel is in this way possible in any form. The isotherm form that is aimed for can be displaced through the strictly axial heat flow over the complete height of the reaction space between cover heater 3 and floor heater 2. The device in accordance with the invention enables the production of monocrystal of different III–V materials with large diameters, such as for example gallium arsenide with a diameter of 2", 3", 100 mm, 125 mm, 150 mm 200 mm and larger.

Depending on the monocrystal that is to be produced, for example in regard of its material or its diameter, the insulator 6 may be designed as a hollow cylinder. The aim is simply to guarantee a strictly axial heat flow and to prevent the heat flowing off in a radial direction. In this way the target can be reached of obtaining a constant rate of crystal growth per time unit.

In a modified form the heat transmission cylinder 6 is not in the shape of a tapered cone but is shaped so that a desired axial isotherm course is achieved. Any particular form is conceivable here and is calculated by means of the desired isotherm course. Any type of desired heat flow can be designed through the form of the material and the type of the material. In this way the target can be reached of obtaining a constant rate of crystal growth per time unit.

What is claimed is:

1. A device for producing a monocrystal by growing the monocrystal from a melt of raw materials with a heating appliance for generating a temperature gradient within the melt of raw material, wherein the heating appliance comprises a rotationally symmetrical furnace with a rotation axis (M) and with an essentially level floor heater and an essentially level cover heater that can be controlled to different temperatures, the device further comprising:

an insulating device that is structured and arranged in such a way that a heat flow in a radial direction perpendicular to the rotation axis (M) of the furnace can be controlled at a preset rate.

2. A device in accord with claim 1, wherein the insulating device is further structured and arranged to provide an insulating effect having a gradient from the cover heater to the floor heater.

3. A device in accord with claim 1, wherein the furnace is cylindrical and further comprising a controller to control a temperature of the floor heater to be lower than a temperature of the cover heater.

4. A device in accord with claim 3, wherein the controller can lower the temperature of the floor heater continuously with reference to the cover heater.

5. A device in accord with claim 1, wherein the insulating device has a tapered cone body with a coaxial cylindrical hollow space that is open at the top and bottom, the insulating device being positioned in the furnace so that the tapered end is towards the floor heater.

6. A device in accord with claim 1, further comprising a jacket heater for the furnace.

7. A device in accord with claim 1, further comprising a heat transmission part having a rotationally symmetrical profiled or unprofiled shape.

8. A device in accord with claim 1, wherein the heaters comprise a heating surface having a ratio to a surface of a monocrystal to be produced to provide a temperature that is essentially homogeneous over a radial cross-section of the monocrystal and a temperature gradient between the floor heater and the cover heater that is essentially constant.

9. A device in accord with claim 8, wherein the surface of each heater is at least 1.5 times the cross-sectional area of the monocrystal.

10. A device in accord with claim 1, the device further comprising a clearance between the floor heater and the cover heater, the clearance being greater than the length of a monocrystal to be produced.

11. A device in accord with claim 1, wherein said insulating device comprises graphite.

12. A device in accord with claim 1, further comprising a crucible for receiving the melt of raw material, the crucible being located between the floor heater and the cover heater.

13. A device in accord with claim 1, wherein the furnace is cylindrical and further comprising:
   a controller to control a temperature of the floor heater to be lower than a temperature of the cover heater;
   an insulator device having a tapered cone body with a coaxial cylindrical hollow space that is open at the top and bottom, the insulator device being positioned in the furnace so that the tapered end is towards the floor heater;
   a jacket heater for the furnace;
   a crucible for receiving the melt of raw material, the crucible being located between the floor heater and the cover heater; and
   a clearance between the floor heater and the cover heater, the clearance being greater than the length of a monocrystal to be produced.

14. A device in accord with claim 13, further comprising a heat transmission part having a rotationally symmetrical profiled or unprofiled shape.

15. A device in accord with claim 14, wherein the floor and cover heaters comprise a heating surface having a ratio to a surface of a monocrystal to be produced to provide a temperature that is essentially homogeneous over a radial cross-section of the monocrystal and a temperature gradient between the floor heater and the cover heater that is essentially constant.

16. A device in accord with claim 15, wherein the surface of each of the floor and cover heaters is at least 1.5 times the cross-sectional area of the monocrystal.

17. A device in accord with claim 13, wherein the controller can lower the temperature of the floor heater continuously with reference to the cover heater.

18. A device in accord with claim 13, wherein said insulating device comprises graphite.

19. A device in accord with claim 1, wherein said insulting device comprises graphite.

20. A device for producing a monocrystal by growing the monocrystal from a melt of raw materials with a heating appliance for generating a temperature gradient within the melt of raw material, wherein the heating appliance comprises a rotationally symmetrical furnace with a rotation axis (M) and with an essentially level floor heater and an essentially level cover heater that can be controlled to different temperatures, the device further comprising:
   an insulating device that is structured and arranged to provide an insulating effect having a gradient from the cover heater to the floor heater.

21. A device in accord with claim 20, wherein the furnace is cylindrical and further comprising a controller to control a temperature of the floor heater to be lower than a temperature of the cover heater.

22. A device in accord with claim 20, wherein the insulating device has a tapered cone body with a coaxial cylindrical hollow space that is open at the top and bottom, the insulator device being positioned in the furnace so that the tapered end is towards the floor heater.

23. A device in accord with claim 20, wherein the heaters comprise a heating surface having a ratio to a surface of a monocrystal to be produced to provide a temperature that is essentially homogeneous over a radial cross-section of the monocrystal and a temperature gradient between the floor heater and the cover heater that is essentially constant.

24. A device in accord with claim 21, wherein the controller can lower the temperature of the floor heater continuously with reference to the cover heater.

25. A method for producing a monocrystal of a III–V composite semiconductor material, said method comprising growing the monocrystal in a device according to any one of claims 1 to 19.

26. A method for producing a monocrystal of gallium arsenide, said method comprising growing the monocrystal in a device according to any one of claims 1 to 19.

* * * * *

UNITED STATES PATENT AND TRADEMARK OFFICE
CERTIFICATE OF CORRECTION

PATENT NO. : 6,712,904 B1
DATED : March 30, 2004
INVENTOR(S) : Sonnenberg et al.

It is certified that error appears in the above-identified patent and that said Letters Patent is hereby corrected as shown below:

<u>Title page,</u>
Item [73], Assignee, change "Forschungszentrum Julich GmbH" to
-- Forschungszentrum Jülich GmbH --; and change "Frieberger Compound Materials GmbH" to -- Freiberger Compound Materials GmbH --.

Signed and Sealed this

Thirtieth Day of November, 2004

JON W. DUDAS
*Director of the United States Patent and Trademark Office*